United States Patent
Abdullah et al.

(10) Patent No.: US 9,348,398 B2
(45) Date of Patent: May 24, 2016

(54) METHOD AND APPARATUS FOR DISTINGUISHING MOMENTARY LOSS OF BATTERY CONTACT FROM AN UNDERVOLTAGE CONDITION

(71) Applicant: MOTOROLA SOLUTIONS, INC, Schaumburg, IL (US)

(72) Inventors: Mohd Faisal Abdullah, Gelugor (MY); Kean Giap Ng, Gelulor (MY); Beng Kwang Tan, Bayan Lepas (MY)

(73) Assignee: MOTOROLA SOLUTIONS, INC., Schaumburg, IL (US)

( * ) Notice: Subject to any disclaimer, the term of this patent is extended or adjusted under 35 U.S.C. 154(b) by 183 days.

(21) Appl. No.: 14/319,560

(22) Filed: Jun. 30, 2014

(65) Prior Publication Data

US 2015/0002161 A1 Jan. 1, 2015

(51) Int. Cl.
*G01N 27/416* (2006.01)
*G06F 1/32* (2006.01)
*G01R 31/36* (2006.01)
*G01R 31/02* (2006.01)

(52) U.S. Cl.
CPC ............ *G06F 1/3212* (2013.01); *G01R 31/026* (2013.01); *G01R 31/3693* (2013.01); *Y02B 60/1292* (2013.01)

(58) Field of Classification Search
CPC ...................... G01R 19/16542; G01R 31/3648; G01R 31/3658; G01R 31/3682; Y02E 60/12; H02H 3/24; H02H 3/253; H02H 3/247; H02H 3/243; H02J 9/002
USPC ......................................................... 324/433
See application file for complete search history.

(56) References Cited

U.S. PATENT DOCUMENTS

| 7,768,247 | B2 | 8/2010 | Sasaki et al. | |
| 8,000,073 | B2 | 8/2011 | Schuelke et al. | |
| 2001/0021092 | A1* | 9/2001 | Astala | H02J 7/0029 361/90 |
| 2002/0087908 | A1 | 7/2002 | Dossey et al. | |
| 2003/0142513 | A1* | 7/2003 | Vinciarelli | H02J 1/102 363/17 |
| 2004/0164708 | A1* | 8/2004 | Veselic | H02J 7/0068 320/132 |
| 2004/0227487 | A1* | 11/2004 | Xiong | H02J 7/0052 320/116 |
| 2005/0111242 | A1* | 5/2005 | Oh | H02M 3/33515 363/21.07 |
| 2005/0122140 | A1* | 6/2005 | Peker | H04L 12/10 327/108 |
| 2006/0014646 | A1 | 1/2006 | Nomura et al. | |
| 2006/0102397 | A1* | 5/2006 | Buck | B60L 11/1887 429/432 |
| 2006/0136755 | A1 | 6/2006 | Qawami et al. | |
| 2007/0041436 | A1 | 2/2007 | Yang | |
| 2008/0238370 | A1* | 10/2008 | Carrier | H01M 2/1022 320/134 |
| 2009/0015209 | A1* | 1/2009 | Morina | H02J 7/041 320/153 |
| 2009/0193278 | A1 | 7/2009 | Camilleri et al. | |
| 2009/0303641 | A1 | 12/2009 | Abe | |
| 2012/0194955 | A1 | 8/2012 | Billingsley et al. | |

FOREIGN PATENT DOCUMENTS

JP 2006115594 A 4/2006

\* cited by examiner

*Primary Examiner* — Arun Williams
(74) *Attorney, Agent, or Firm* — Scott M. Garrett

(57) ABSTRACT

A method and apparatus for distinguishing momentary loss of battery contact from a battery undervoltage condition in a portable device sense the current into the portable device from the battery, and when the current drops to a level indicating that contact with the battery has been lost, the portable device is allowed to operate at a lower voltage than a nominal undervoltage limit of the battery until contact is resumed.

20 Claims, 3 Drawing Sheets

METHOD AND APPARATUS FOR DISTINGUISHING MOMENTARY LOSS OF BATTERY CONTACT FROM AN UNDERVOLTAGE CONDITION

This application is a US National Filing and is filed within one year of, and claims priority to under 35 U.S.C. §119, Malaysian Patent Application No. PI 2013701162, filed in the Malaysian Patent Office on Jul. 1, 2013, the entire contents of which are incorporated herein by reference.

FIELD OF THE DISCLOSURE

The present disclosure relates generally to battery powered portable devices and more particularly to portable two-way radio devices where contact with the battery powering the portable two-way radio device can be intermittently or momentarily lost.

BACKGROUND

Portable electronic devices, or simply portable devices, are battery powered. Many such devices are powered by rechargeable batteries or battery packs because the device uses so much energy that it would be cost prohibitive to constantly replace spent non-rechargeable battery cells. For example, cellular telephones and portable two-way radio devices typically use rechargeable battery packs because of how much energy they use. There are a variety of rechargeable battery technologies that are popular and presently in use. Generally, it is desirable to have the highest energy storage density, referred to as charge capacity, because it allows for the smallest battery for a given expected usage time.

Among the well-known battery technologies presently in popular usage, lithium ion (Li-ion) batteries are one of the more popular technologies because of their high energy storage density, making them especially popular for portable devices that are routinely carried, such as communication devices. However, Li-ion batteries are subject to certain operating limitations which, if exceeded, can greatly shorten the life of the battery, referring to the number of charge/discharge cycles. One parameter that is of particular concern is the undervoltage limit. The undervoltage limit is the lowest voltage that the battery should be allowed to drop to during discharge. Allowing the voltage to drop lower than the undervoltage limit can reduce the battery life. To prevent an undervoltage condition, some portable devices sense the battery voltage, and when the battery voltage drops to the undervoltage limit, shut themselves off, or shut off most of the device so as not to continue to discharge the battery below the undervoltage limit, even though the electronics can continue to operate at voltage levels below the undervoltage limit. The portable device maintains itself off, ignoring attempts by the user to turn the portable device back to an operating state, until the battery is recharged or removed and replaced.

Another issue that affect portable devices is intermittent battery contact. Typically a battery is attached to a portable device using a plurality of contacts. A contact is an electrically conductive element that presents a surface that mates with a corresponding contact, and the two contacts are generally urged or held against each other by, for example, a spring means. As a result, when the portable device (with the battery attached) experiences a momentary mechanical shock, such as upon being dropped, the contacts that are normally touching to provide an electrical connection can momentarily lose contact. When that happens, a portable device designed to shut itself off upon an undervoltage condition could shut itself off, mistaking the momentary loss of battery contact for an undervoltage condition. Given the critical need for continuous operation of some portable devices, such as two-way radio devices used by law enforcement, public safety, rescue, and military personnel, having a device shut itself off upon experiencing a momentary shock could be detrimental.

Accordingly, there is a need for a method and apparatus for distinguishing momentary loss of battery contact from an undervoltage condition in a portable device.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
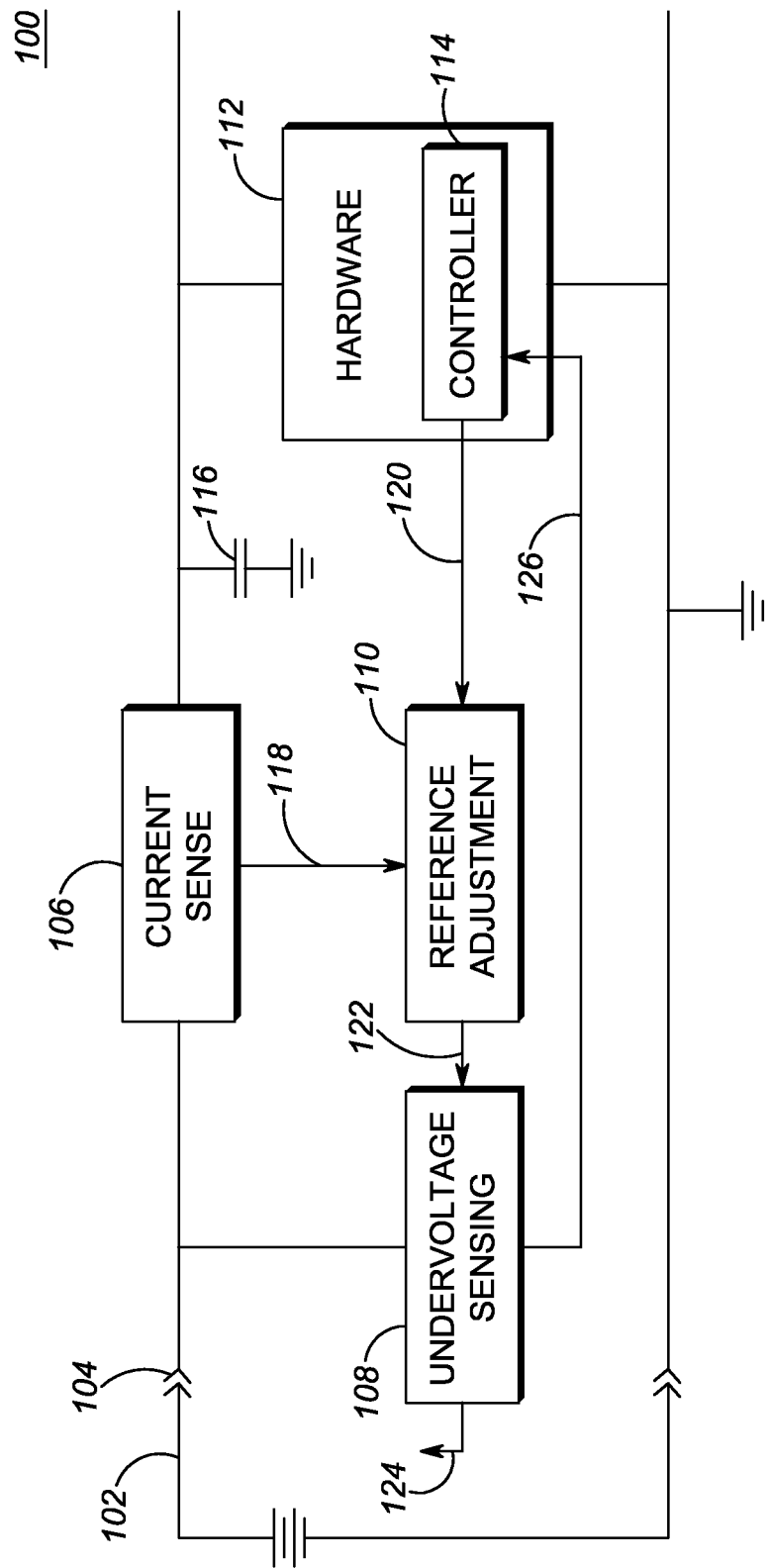
FIG. 1 is a block diagram of a portable device in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Embodiments described herein include a circuit for distinguishing a momentary loss of battery contact from a battery undervoltage condition in a portable device. The circuit includes an undervoltage sensing circuit that senses a battery voltage provided at a battery contact of the portable device, and compares the battery voltage to an undervoltage reference voltage level corresponding to an undervoltage limit. The undervoltage sensing circuit provides an undervoltage signal to a controller of the portable device when the battery voltage falls below the undervoltage limit. The circuit further includes a current sensing circuit that senses current flowing into the portable device from the battery, and provides a low current signal while the current is below a current threshold. The circuit further includes a reference adjustment circuit that compares the low current signal with a power on flag provided by the controller of the portable device indicating the portable device is powered on. The reference adjustment circuit lowers the undervoltage reference voltage level to a reduced value only while the low current signal indicates the current is below the current threshold and the power on flag indicates the portable device is powered on.

FIG. 1 is a block diagram of a portable device 100 in accordance with some embodiments. The portable device 100 is powered by a battery 102, and in particular a rechargeable battery. The battery 102 includes one or more battery cells and is attached to the portable device using contacts such as battery contact 104. The battery can use a type of battery cell that is subject to an undervoltage limit, which is the lowest voltage the battery cell should be allowed to experience to optimize the life of the battery cell. If the battery 102 includes a plurality of battery cells electrically connected in series, then the undervoltage limit of the battery can be selected to be the product of the per cell undervoltage limit and the number of battery cells connected in series. The portable device 100 includes a hardware section 112 that is powered by the battery 102. The hardware section 112 includes some, of not all of the circuitry of the portable device, and can include a variety of circuits and components to carry out the operations of the portable device 100.

Current from the battery 102 reaches the hardware section 112 by passing through a current sensing circuit 106. The current sensing circuit 106 sensing the magnitude of the current through a current sensing element to determine if the magnitude of the current is greater than a preselected current threshold. In some embodiments the preselected current threshold can be zero current. The current sensing circuit 106 provides a low current signal 118 when the current through the current sensing circuit 106 from the battery to the hardware section 112 drops below, or is equal to, the current threshold. When battery contact is momentarily lost at, for example, battery contact 104, due to, for example, mechanical shock, the current through the current sense circuit 106 will drop to zero (or less if current flows in the reverse direction). Thus, during the momentary loss of battery contact, the low current signal 118 will be asserted by the current sense circuit 106. However, the hardware section 112 can continue to operate by virtue of a bulk capacitor 116 that stores charge from the battery, and provides charge upon the momentary loss of battery contact to the hardware section 112.

To detect undervoltage conditions, an undervoltage sensing circuit 108 senses the battery voltage that is provided to the battery contact 104. A reference voltage 124 is provided to the undervoltage sensing circuit 108. The reference voltage 124 is a stable voltage that does not substantially change over temperature or the input voltage, as is known. The reference voltage can be divided down using, for example, a resistor divider, to provide a lower reference voltage. The reference voltage or a divided down level of the reference voltage can be sued to establish an undervoltage reference voltage level that the undervoltage sensing circuit 108 uses to detect undervoltage conditions. While the reference voltage 124, or a divided version of the reference voltage does not change, the battery voltage at the battery contact will change as the battery discharges during use. Thus, once the battery voltage decreases to the undervoltage limit, the undervoltage sensing circuit will provide an undervoltage signal 126 to a controller 114 in the hardware section 112. The controller will, responsive to the undervoltage signal, clear a "power on" flag 120, and shut off most of the circuitry in the hardware section 112 so as not to discharge the batter 102 any further. The power on flag is set (at a logic high level, the equivalent of a digital "1") when the battery voltage is above the undervoltage limit as indicated by the undervoltage signal 126 being absent, and it is cleared (set to logic low level, the equivalent of a digital "0") when the battery voltage initially falls below the undervoltage limit since the controller effectively shuts off the portable device 100.

Upon a momentary loss of battery contact, the voltage at the battery contact 104, which is being sensed by the undervoltage sensing circuit 108, can drop below the undervoltage reference voltage level, causing the undervoltage sensing circuit 108 to produce the undervoltage signal 126, which would cause the controller to clear the power on flag 120 and shut the portable device 100 off. During the momentary loss of battery contact, however, the bulk capacitor 116 can provide enough current to keep the hardware section 112 operating for a short time, and allow the battery contact to be resumed. To prevent a false undervoltage condition due to a momentary loss of battery contact from causing the portable device 100 from being shut off, a reference adjustment circuit 110 is used to temporarily lower the threshold used by the undervoltage sensing circuit during the momentary loss of battery contact.

The reference adjustment circuit 110 compares the low current signal 118 with the power on flag 120, and when both are high, indicating the portable device is presently powered on, and there is an insufficient level of current coming from the battery 102, the reference adjustment circuit 110 lowers the reference level used by the undervoltage sensing circuit 108 as the undervoltage reference voltage level. In that way, during the momentary loss of battery contact, the hardware section can continue to operate from the bulk capacitor 116 since the hardware section 112 can operate at a voltage level that is lower than the undervoltage limit of the battery 102. Thus, the undervoltage sensing circuit will not assert the undervoltage signal 126 until and unless the voltage provided by the bulk capacitor 116 falls below the lowered undervoltage reference voltage level. Should battery contact (meaning the electrical connection) be reestablished before the voltage provided by the bulk capacitor falls below the lowered undervoltage reference voltage level, current will again flow through the current sensing circuit 106 from the battery contact to the hardware section 112 (and the bulk capacitor 116), causing the current sensing circuit 106 to clear the low current signal 118, which in turn causes the reference adjustment circuit to clear an adjustment signal 122 that adjusts the undervoltage reference voltage level, thereby raising the undervoltage reference voltage level to the proper undervoltage limit of the battery.

Figure 2:
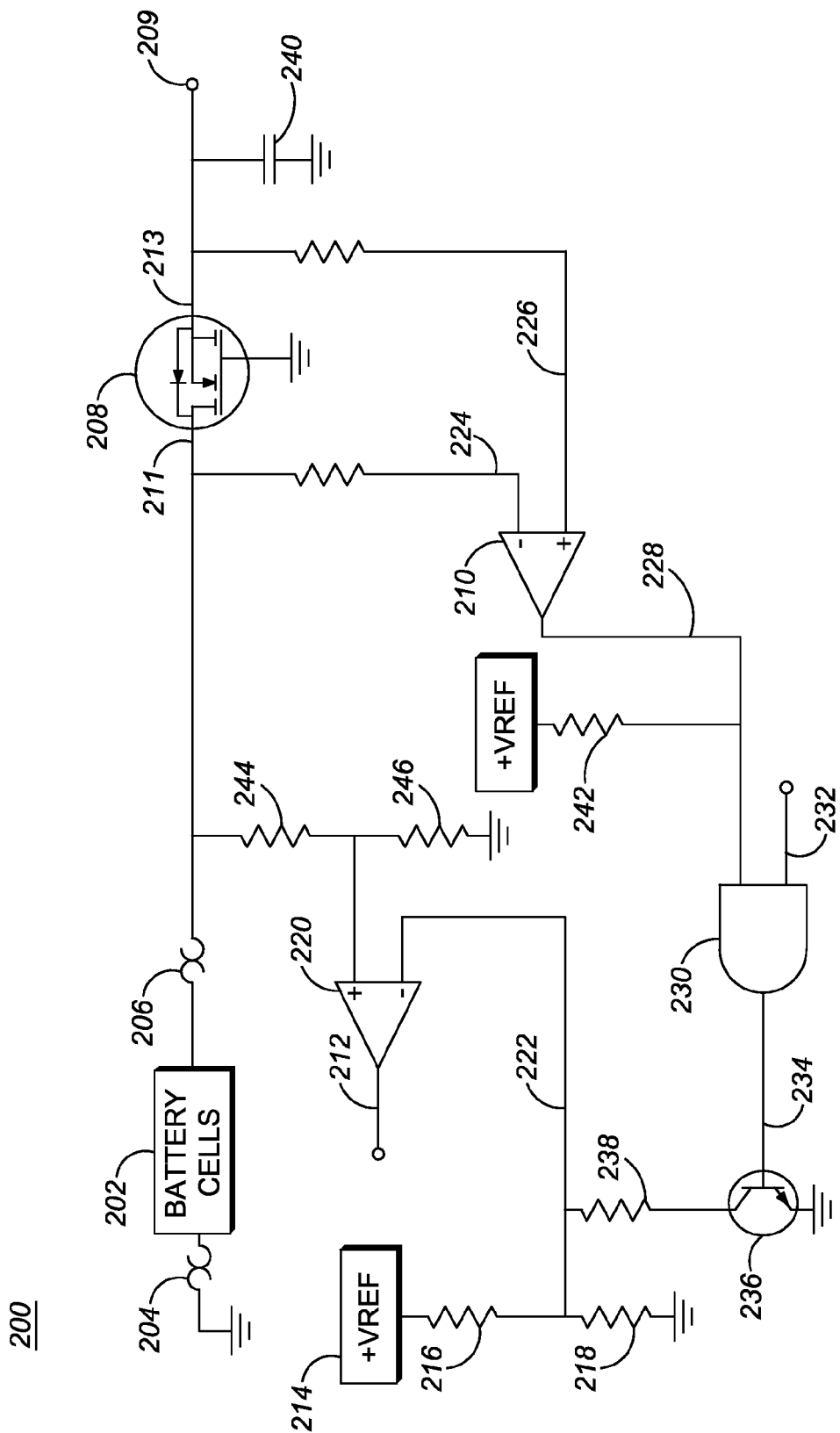
FIG. 2 is a schematic diagram of circuit for distinguishing between an undervoltage condition and a momentary loss of battery contact for a portable device in accordance with some embodiments.

FIG. 2 is a schematic diagram of circuit 200 for distinguishing between an undervoltage condition and a momentary loss of battery contact for a portable device in accordance with some embodiments. The circuit 200 is one example of an implementation of some embodiments. Variations will occur to those skilled in the art. A battery 202 including battery cells can be connected to the portable device via battery contacts 204, 206, which can be a negative contact and a positive contact, respectively. Current flows from the battery to node 209 which can be connected to a hardware section (not shown) such as hardware section 112 of FIG. 1. The current sensing circuit is comprised of a current sensing element 208 which is generally a resistive element. However, to minimize power losses in the current sensing element 208 it can be a very low resistance element such as a metallic oxide semiconductor field effect transistor (MOSFET). The MOSTFET has a "positive" side 211 and a negative side 213. During normal operation current from the battery, through the current sense element 208 from the positive side 211 to the negative side 213, to the node 209. The current sensing circuit further includes a comparator 210 that has a negative input 224 connected to the positive side 211 of the current sense element 208, and a positive input 226 that is connected to the negative side 213 of the current sense element. When current is flowing through the current sense element 208 from the positive side 211 to the negative side 213, the negative input 224 of the comparator 210 will be at a slightly higher voltage level than the positive input 226 of the comparator 210, causing the output 228 to be low. However, when there is a loss of battery contact, current flows from the bulk capacitor 240 through the current sense element 208 from the negative side 213 to the positive side 211, causing the output 228 to go high. The output 228 operates as the low current signal 118 of FIG. 1.

An undervoltage sensing circuit is comprised of an input voltage divider including resistors 244, 246, that are used to provide a proportional sample voltage to an undervoltage comparator 220. The sampled voltage from the resistor divider 244, 246 is compared with an undervoltage reference voltage level 222 that is produced by dividing a stable reference voltage 214 by an upper divider resistor 216 and a lower divider resistor 218. Thus, while the sampled voltage is above the undervoltage reference voltage level, the output 212 of the undervoltage comparator 220 will be high. When the sampled voltage falls below the undervoltage reference voltage level, the output 212 will go low, which is equivalent to the undervoltage signal 126 of FIG. 1.

A reference adjustment circuit is comprised of a logical AND gate 230, an adjustment resistor 238, and an adjustment transistor 236. The AND gate 230 compares, or "ANDs," the output 228 of the comparator 210 and the power on flag 232, provided by a controller (not shown). When, and only when, both the output 228 and the power on flag are high, the output 234 of the AND gate 230 will likewise go high, causing adjustment transistor 236 to switch on, effectively connecting adjustment resistor 238 in parallel with lower divider resistor 218, thereby lowering the undervoltage reference voltage level 222.

Thus, during a momentary loss of battery contact, power on flag 232 will be high, indicating the portable device is supposed to be powered on presently, the current sense circuit's comparator 210 will produce a high on its output 228, and the reference adjustment circuit via AND gate 230 will lower the undervoltage reference voltage level. As such, the undervoltage comparator 220 will not assert the undervoltage signal, via output 212 which is provided to the controller (not shown), until the sensed voltage falls to a level corresponding to the lower undervoltage reference voltage level, allowing circuitry connected to node 209 to continue to operate until the battery is reconnected, of the bulk capacitor 240 is depleted of charge to the point the sensed voltage falls below the value corresponding to the lowered undervoltage reference voltage level.

Figure 3:
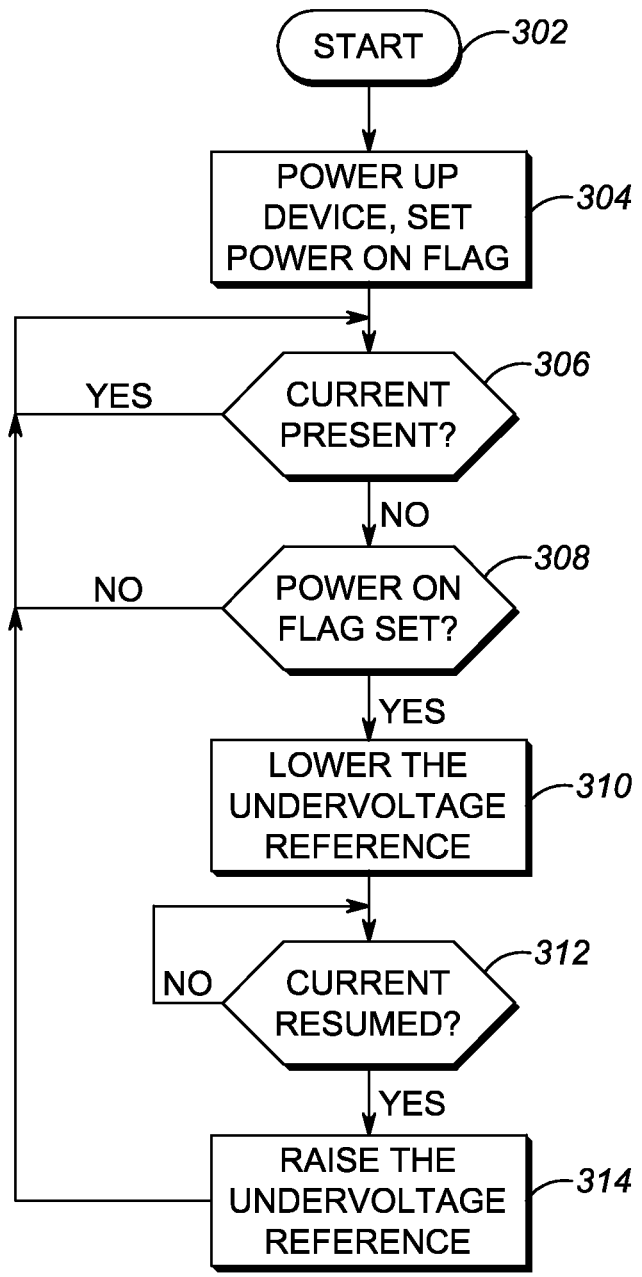
FIG. 3 shows a flow chart diagram of a method for distinguishing between an undervoltage condition and a momentary loss of battery contact for a portable device in accordance with some embodiments.

FIG. 3 shows a flow chart diagram of a method 300 for distinguishing between an undervoltage condition and a momentary loss of battery contact for a portable device in accordance with some embodiments. The portable device can be one such as portable device 100 of FIG. 1. At the start 302 the portable device is powered on, connected to a battery, and the battery voltage is above the undervoltage limit. Accordingly, the power on flag is set, indicating the portable device is properly operating and can remain on, as indicated in process 304. While operating, the current sensing circuit continuously sensing battery current, as indicated by process 306. The current sensing can be performed by a current sensing circuit such as current sensing circuit 106 of FIG. 1, or the current sense element 208 and comparator 210 of FIG. 2. As long as there is current present, meaning current flowing from the battery to the portable device circuitry, the method stays at process 306. When the current drops below a current threshold, however, such as when there is no battery current present, the method 300 advances to process 308 where the method 300 determines if the power on flag is presently set. If both the current is low and the power on flag is set, the method then lowers the undervoltage reference voltage level to allow the portable device to continue operating below a nominal undervoltage limit, as indicated by process 310. The method 300 then waits until the contact is reestablished or resumed in process 312. Upon the battery contact being resumed, the undervoltage reference voltage level is then raised back to a level corresponding to the nominal undervoltage limit for the battery in process 314, whereupon the method resets back to process 306. Thus, The reference adjustment circuit lowers the undervoltage reference voltage level to a reduced value only while the low current signal indicates the current is below the current threshold and the power on flag indicates the portable device is powered on, and then raises the undervoltage reference voltage level back to a level corresponding to the nominal undervoltage limit of the battery when the current resumes.

The disclosed embodiments therefore allow a portable device to continue operating during a momentary loss of battery contact so as to not shut off the portable device for fear of causing the battery voltage to experience an undervoltage limit. This provides the benefit of continuous operation of the portable device despite momentary interruptions of contact with the battery, which can be crucial in various circumstances where the portable device may be operated.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A circuit for distinguishing momentary loss of battery contact from a battery undervoltage condition in a portable device, comprising:
   an undervoltage sensing circuit that senses a battery voltage provided at a battery contact of the portable device and compares it to an undervoltage reference voltage level corresponding to an undervoltage limit and provides an undervoltage signal to a controller of the portable device when the battery voltage falls below the undervoltage limit;
   a current sensing circuit that senses current into the portable device from the battery, and provides a low current signal while the current is below a current threshold; and
   a reference adjustment circuit that compares the low current signal with a power on flag provided by the controller of the portable device indicating the portable device is powered on, wherein the reference adjustment circuit lowers the undervoltage reference voltage level to a reduced value only while the low current signal indicates the current is below the current threshold and the power on flag indicates the portable device is powered on.

2. The circuit of claim 1, wherein the undervoltage limit is based on an undervoltage limit of the battery.

3. The circuit of claim 1, wherein the current sensing circuit comprises a resistive element as a current sensing element.

4. The circuit of claim 1, wherein the current sensing circuit comprises a metallic oxide semiconductor field effect transistor (MOSFET) in series between the battery contact and a bulk capacitance of the portable device, wherein bulk capacitance is coupled in parallel with the controller.

5. The circuit of claim 4, wherein the bulk capacitance allows a hardware second of the portable device including the controller to continue operating during the momentary loss of battery contact.

6. The circuit of claim 4, wherein the current sense circuit comprises a comparator having a positive input and a negative input, wherein the positive input is connected to a positive side of the MOSFET and the negative input is connected to a negative side of the MOSFET, wherein current from the battery passes through the MOSTFET from the positive side to the negative side of the MOSFET.

7. The circuit of claim 1, wherein the reference adjustment circuit comprises a logical AND gate that compares the low current signal and the power on flag.

8. The circuit of claim 1, wherein the current threshold is zero current.

9. The circuit of claim 1, wherein the reduced value of the undervoltage reference voltage level corresponds to a voltage sufficient to allow at least the controller of the portable device to operate.

10. A method for distinguishing a momentary loss of battery contact from a battery undervoltage condition in a portable device, comprising:
    comparing a voltage level at a battery contact with an undervoltage reference voltage level corresponding to an undervoltage limit, and providing an undervoltage signal when the battery voltage falls below the undervoltage limit;
    detecting a current passing through the battery contact and providing a low current signal when the current is below a current threshold;
    lowering the undervoltage reference voltage level to a reduced value only while the low current signal indicates the current is below the current threshold and a power on flag provided by a controller of the portable device indicates the portable device is powered on; and
    when the undervoltage reference voltage level is lowered, operating at least a portion of the portable device, including the controller, from a bulk capacitor coupled in parallel with the portion of the portable device, and maintaining the power on flag.

11. The method of claim 10, wherein comparing the voltage level at the battery contact with the undervoltage reference voltage level comprises comparing the voltage level at the battery contact with the undervoltage reference voltage level wherein the undervoltage reference voltage level is based on an undervoltage limit of the battery.

12. The method of claim 10, wherein detecting the current passing through the battery contact comprises detecting the current passing through a metallic oxide semiconductor field effect transistor (MOSFET) that is in series between the battery contact and the portion of the portable device.

13. The method of claim 12, detecting the current passing through the battery contact is performed by a comparator having a positive input and a negative input, wherein the positive input is connected to a positive side of the MOSFET and the negative input is connected to a negative side of the MOSFET, wherein current from the battery contact passes through the MOSTFET from the positive side to the negative side of the MOSFET.

14. The method of claim 10, wherein lowering the undervoltage reference voltage level is performed by a logical AND gate that compares the low current signal and the power on flag and provides an output that switches an adjustment resistance in parallel with a lower divider resistor of a voltage divider network that divides a reference voltage down to the undervoltage reference voltage level.

15. The method of claim 10, wherein providing the low current signal comprises providing the low current signal when the current level is zero current.

16. The method of claim 10, wherein lowering the undervoltage reference voltage level comprises lowering the undervoltage reference voltage level to a voltage sufficient to allow at least the controller of the portable device to operate.

17. A portable device that is powered by battery that provides voltage and current via at least one battery contact, comprising:
 a hardware section including a controller;
 a current sense element connected in series between the battery contact and the hardware section;
 a bulk capacitor having first and second terminals, with one terminal coupled in parallel with the hardware section;
 a current sense comparator that senses a current through the current sense element and provides a low current signal while the current is below a current threshold;
 an undervoltage sensing circuit that senses a battery voltage provided at the battery contact of the portable device and compares it to an undervoltage reference voltage level that corresponds to an undervoltage limit and provides an undervoltage signal to the controller when the battery voltage falls below the undervoltage limit; and
 a reference adjustment circuit that compares the low current signal with a power on flag provided by the controller that indicates the portable device is powered on, wherein the reference adjustment circuit lowers the undervoltage reference voltage level to a reduced value only while the low current signal indicates the current is below the current threshold and the power on flag indicates the portable device is powered on.

18. The portable device of claim 17, wherein the current sensing element comprises a metallic oxide semiconductor field effect transistor (MOSFET).

19. The portable device of claim 18, wherein the current sense comparator comprises a comparator having a positive input and a negative input, wherein the positive input is connected to a positive side of the MOSFET and the negative input is connected to a negative side of the MOSFET, wherein current from the battery passes through the MOSTFET from the positive side to the negative side of the MOSFET.

20. The portable device of claim 17, wherein the reference adjustment circuit comprises a logical AND gate that compares the low current signal and the power on flag.

* * * * *